Figure 1:
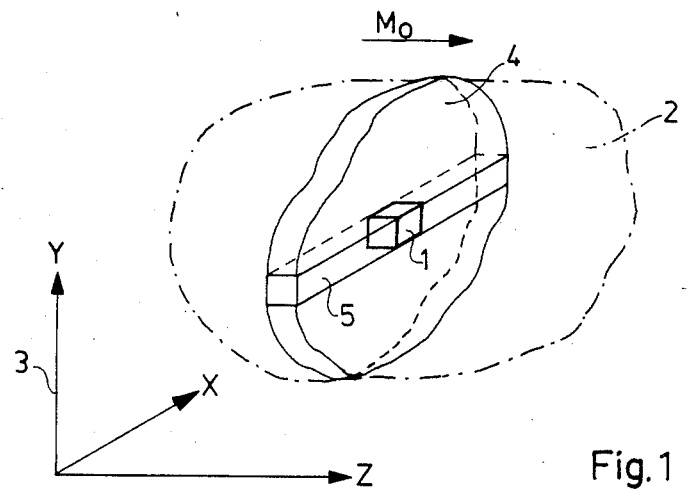

United States Patent [19]

Post et al.

[11] Patent Number: 4,558,277

[45] Date of Patent: Dec. 10, 1985

[54] METHOD FOR MEASURING THE NUCLEAR MAGNETIC RESONANCE

[75] Inventors: Hans Post, Schriesheim; Dieter Ratzel, Rheinstetten; Peter Brunner, Ettlingen, all of Fed. Rep. of Germany

[73] Assignee: Bruker Medizintechnik GmbH, Fed. Rep. of Germany

[21] Appl. No.: 474,555

[22] Filed: Mar. 11, 1983

[30] Foreign Application Priority Data

Mar. 13, 1982 [DE] Fed. Rep. of Germany ....... 3209263

[51] Int. Cl.⁴ ............................................. G01R 33/08
[52] U.S. Cl. ..................................... 324/309; 324/307
[58] Field of Search ......................... 324/300, 307, 309

[56] References Cited

U.S. PATENT DOCUMENTS 4,021,726 5/1977 Garroway ........................... 324/309
4,070,611 1/1978 Ernst .................................... 324/309

Primary Examiner—Michael J. Tokar
Attorney, Agent, or Firm—Fowler, Lambert & Hackler

[57] ABSTRACT

For the purpose of limiting NMR spectroscopy to a selected area of a body the said area is prepared by applying first a homogeneous magnetic field passing through the entire body and superimposing thereafter upon the said magnetic field a first magnetic field of identical orientation whose strength varies in a first sense (first field gradient), exciting thereafter all the selected nuclear spins present within the body and in addition, selectively, only the nuclear spins present in a first body plane containing the volume element and extending vertically to the said first field gradient so that the selected nuclear spins contained in this body plane are returned to the direction of the homogeneous magnetic field while the nuclear spins outside this plane receive an orientation differing from the sense of the homogeneous magnetic field. This process is repeated twice, using each time a different gradient field, so that thereafter only the nuclear spins located within the volume element selected by means of the three gradient fields are parallel to the homogeneous magnetic field and can be excited by means of one or more pulses to obtain an oscillation generating an induction signal.

8 Claims, 8 Drawing Figures

METHOD FOR MEASURING THE NUCLEAR MAGNETIC RESONANCE

The present invention relates to a method for measuring the nuclear magnetic resonance in a selected volume element of a body, in which the interesting nuclear spins contained in the selected volume element are selectively excited while being subjected to a highly homogeneous stationary magnetic field.

A method of this type has been described in a publication entitled "Topical Magnetic Resonance Spectroscopy" published by Messrs. OXFORD Research Systems. It permits to obtain highly resolved NMR spectra of the selected areas of a larger body. Such highly resolved spectra of specific areas of a body make it possible, for instance, to observe biochemical processes in a living body, for instance metabolic processes in the muscle tissue, the liver and the like, without requiring an operation or other mechanical treatment of the body. The report describing such examinations carried out in living bodies had been published on pages 736 to 738 of Nature 287 (1980). In the known method, the volume element available for high-resolution NMR spectroscopy is determined by applying a complex gradient field whose field strength is substantially constant in the area of the selected volume element, but varies greatly in the neighbouring areas. This known method presents the disadvantage that very complicated devices and arrangements are required for generating the very complex gradient field and—what counts even more—that the location of the selected volume element is substantially determined by the location of the magnet coils used for generating the gradient fields and cannot, accordingly, be changed relative to these coils. As a result, the sample body must be given a position ensuring that the volume element of the body to be observed lies exactly in that area of the coil arrangement where the homogeneous area of the magnetic field is to be found. So, the selection of volume elements is restricted to the central area of the sample body, at least in the case of bodies of large volume. Another disadvantage of the known method is to be seen in the fact that during the measurement signals are received also from areas adjoining the selected volume element in which the magnetic field is highly inhomogeneous and that, accordingly, a compensation of the measurements obtained with respect to these inhomogeneities is required.

Now, it is the object of the present invention to provide a method for localized nuclear resonance spectroscopy which allows the location of the selected volume elements to be selected within very broad limits without the necessity to make mechanical changes to the devices and/or to displace the sample body.

According to the invention, this object is achieved by a method characterized by the steps of superimposing upon the homogeneous magnetic field passing through the entire body a first magnetic field of identical orientation whose strength varies in a first sense (first field gradient), exciting thereafter all the selected nuclear spins present within the body and in addition, selectively, only the nuclear spins present in a first body plane containing the volume element and extending vertically to the said first field gradient so that the selected nuclear spins contained in this body plane are returned to the sense of the homogeneous magnetic field while the nuclear spins outside this plane have an orientation differing from the sense of the homogeneous magnetic field, switching off thereafter the first gradient field and superimposing upon the homogeneous magnetic field a second gradient field exhibiting in turn an orientation identical to that of the homogeneous magnetic field and varying in a sense vertical to the first field gradient (second field gradient), effecting thereafter a second similar excitation of the entirety of the selected nuclear spins contained in the selected body plane and a selective excitation of the selected nuclear spins contained only in a plane containing the volume element and extending vertically to the second field gradient, whereafter the nuclear spins contained in a strip defined by the intersection lines of the two planes resume again an orientation identical to that of the homogeneous magnetic field, switching off thereafter the second gradient field and superimposing upon the homogeneous magnetic field a third gradient field having the same orientation as the homogeneous magnetic field and varying in a sense perpendicular to the said first and the said second field gradients (third field gradient), effecting thereafter a third similar excitation of the entirety of the selected nuclear spins in the strip and a selective excitation of only those nuclear spins which are contained in a third plane containing the volume element and extending perpendicularly to the said strip so that now only the nuclear spins in the selected volume element have the same orientation as the homogeneous magnetic field, and finally switching off also the third gradient field and exciting the nuclear spins contained in the volume element by means of one or more pulses to obtain an oscillation generating an induction signal.

Just as the known method, the method of the invention takes advantage of the fact that the Larmor frequency of the nuclear spins depends on the strength of the magnetic field to which the nuclear spins are subjected so that when a field gradient is generated the Larmor frequency of the nuclear spins changes its spatial orientation in conformity with the shape of the field gradient so that, consequently, a spatially selective excitation of the nuclear spins can be achieved by proper selection of the excitation frequency. But the method of the invention does not require the use of complex gradient fields. Rather, simple linear gradient fields can be used, and the selected volume element can be displaced at desire along the respective field gradient, by corresponding selection of the frequency of the excitation signal. The successive application of three field gradients extending perpendicularly relative to each other makes it thus possible to select the location of the selected volume freely within the coordinate system defined by the three field gradients.

A particular advantage of the method of the invention is to be seen in the fact that the selective excitation is always effected in a suitable manner for the purpose of either reversing, or supplementing to integral multiples of 180°, an excitation of the nuclear spins contained in the body so that at the end of each excitation the selected nuclear spins resume the sense of the homogeneous magnetic field, while the other nuclear spins form an angle with it. Considering, however, that the excitation processes require a period of time which normally exceeds the spin-spin relaxation time $T_2$, a dispersion of the remaining nuclear spins occurs which has the effect that these nuclear spins finally do not provide a substantial signal contribution. This effect is aided by the fact that when switching over from one gradient field to the next an additional dispersion of those nuclear spins occurs whose orientation differs from the sense of the homogeneous magnetic field. So it is ensured in a very simple manner that at the end of the last excitation only the nuclear spins contained in the selected volume element are oriented in parallel to the sense of the homogeneous magnetic field and, thus, available for measurement after the last gradient field has been switched off. They can now be conventionally excited for any desired nuclear resonance experiment, for instance by a 90° pulse or else a pulse sequence of the type used for improving the signal-to-noise ratio, for measuring relaxation times, and the like. It is of particular advantage that during the actual measurement only the homogeneous magnetic field prevails which can be produced by the methods known from high-resolution NMR spectroscopy. This permits absolutely undisturbed recording of the spectra, without the need to compensate any field inhomogeneities. Consequently, the method of the invention makes it possible to perform high-resolution NMR spectroscopy in a selected volume element of a large body with the same precision and degree of resolution as in small isolated samples.

For exciting the nuclear spins with the gradient fields switched on, the signals used may be of a type normally used in NMR spectroscopy for exciting the nuclear spins. So it is, for instance, convenient to use a 90° pulse for exciting the entirety of the selected nuclear spins. In particular, the nuclear spins may be excited by means of a HF signal effecting initially a rotation of the nuclear spins present in the selected plane by an angle $\alpha$, which is equal to less than 90°, then a rotation of all selected nuclear spins by 90°, and finally again a rotation of the nuclear spins present in the selected plane by an angle equal to $(90° - \alpha)$. The angles $\alpha$ and $(90° - \alpha)$ may be either identically or oppositely directed relative to the 90° rotation to which the entirety of all nuclear spins is subjected, so that following the excitation the selected nuclear spins exhibit an orientation either identical or opposite to that of the homogeneous magnetic field. The angles $\alpha$ and $(90° - \alpha)$ are preferably equal to 45° each. For exciting the nuclear spins, one may use either a HF signal consisting of a sequence of separate pulses with different carrier frequences, amplitudes and/or phases, or else a HF signal formed by one preferably symmetrical pulse with alternating carrier frequency, amplitude and/or phase. Although the before-described dispersion of the selected nuclear spins which have not resumed the sense of the homogeneous magnetic field has the effect that the induction signals supplied by these nuclear spins cancel each other, it may happen that these nuclear spins still supply a resulting signal portion which disturbs the signal obtained from the selected volume element. The method of the invention offers the possibility to eliminate even these noise signals. To this end a further improvement of the invention provides that the measurements are carried our in pairs in a manner such that at the end of the last excitation the nuclear spins contained in the selected volume element are alternately directed in the sense of the homogeneous magnetic field and in opposite sense thereto, and that the induction signals obtained in such successive measurements are subtracted from each other. In this embodiment of the method of the invention the induction signals supplied by the nuclear spins contained in the selected volume element are opposite in phase so that they add up when being subtracted, whereas the signal portions supplied by the other nuclear spins are equal in phase so that they are eliminated when being subtracted. This improvement of the method of the invention may be of particular importance when samples are to be examined which have a relatively small spin-grid relaxation time $T_1$ so that the excitation times must be very short and dispersion of the nuclear spins located outside the selected volume element can be achieved only to an insufficient degree. In exceptionally critical cases it may even be convenient to subject the body, at least when one of the gradient fields is switched on, to a HF signal effecting an almost complete saturation of the selected nuclear spins located outside the selected plane before the nuclear spins are exposed to the excitation fields proper. In this manner, the possible noise signals can be suppressed still further.

Figure 3:
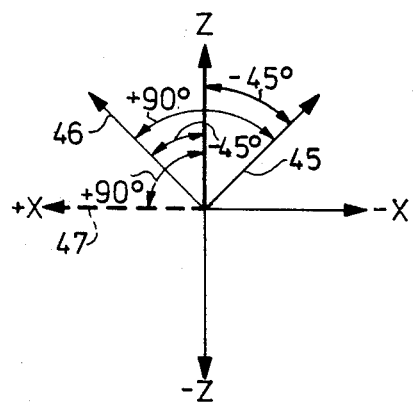
Figure 4:
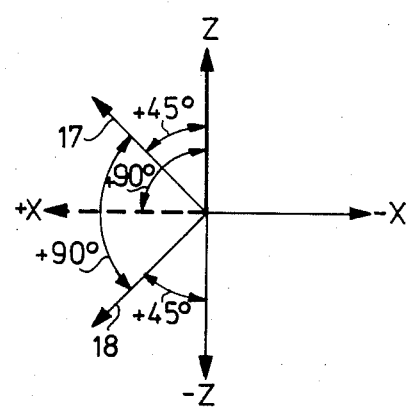

The invention will be described and explained hereafter with reference to the diagrams shown in the drawings in which FIG. 1 is a diagrammatic representation of a body, with a selected volume element and a coordinate system related thereto;

FIGS. 2a, 2b, 2c, 2d and 2e are time diagrams of the signals used for carrying out the method of the invention; and FIGS. 3 and 4 are vector diagrams illustrating the excitation processes encountered in the method of the invention.

FIG. 1 illustrates the volume element 1 of a body 2 which may have any desired shape. The content of the said volume element 1 is to be investigated by high-resolution NMR spectroscopy. To this end, the body 2 is exposed to a homogeneous magnetic field $M_0$ oriented along the Z axis of a related coordinate system 3. High-resolution NMR spectroscopy requires excitation of selected nuclear spins so that the latter supply an induction signal which can be subjected to Fourier analysis in order to determine the frequency components of the induction signal which provides information on the nature of the substance under examination. In order to restrict the examination to the interesting volume element 1, it is necessary to obtain selective excitation of only those nuclear spins which are contained in this volume element.

Figure 2A:
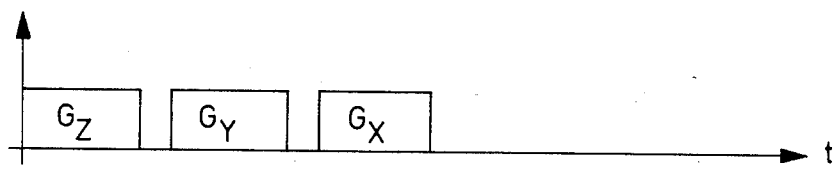
Figure 2B:
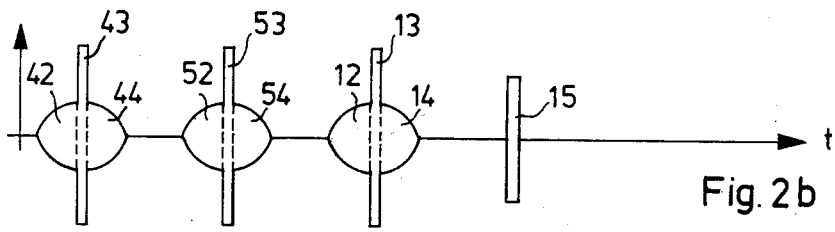
Figure 2C:
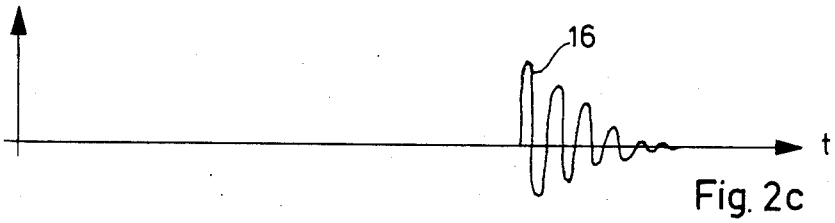
Figure 2D:
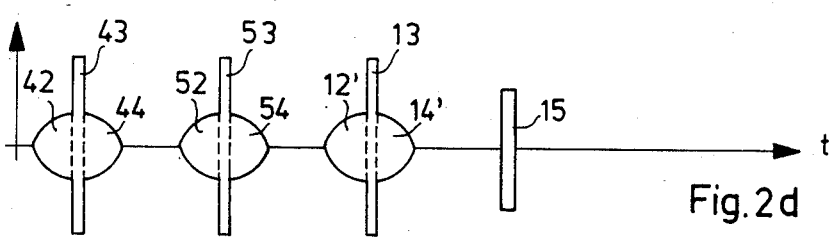

To permit selective excitation of the nuclear spins contained in the volume element 1, the method of the invention provides the step of superimposing initially upon the homogeneous magnetic field $M_0$ a first gradient field $G_Z$ which presents the same orientation as the homogeneous magnetic field $M_0$ but whose strength varies in the direction of the Z axis so that a field gradient in Z direction is obtained. Accordingly, the Larmor frequencies of a selected type of nuclear spins contained in the body 2 vary along the Z axis which makes it possible, by proper selection of a suitable excitation frequency, to selectively excite all those nuclear spins which are to be found in a plane 4 extending vertically to the direction of the field gradient, i.e. in the present case to the sense of the Z axis. When the gradient field $G_Z$ (FIG. 2a) is applied, the body 2 is accordingly subjected to a HF signal consisting of three portions 42, 43, 44 of identical carrier frequency, but different amplitude and phase (FIG. 2b). The envelope and phase of the portion 42 are such that the nuclear spins contained in the plane 4 are rotated in the Z,X plane from the Z direction by $-45°$ into the position indicated by the pointer 45 in FIG. 3. The phase and envelope of the signal portion 43 are such that the entirety of all nuclear spins contained in the body 2 are rotated in the Z,X plane by $+90°$ so that those nuclear spins contained in the plane 4 which were previously rotated by −45° are now displaced by +45° relative to the Z axis, as indicated by the pointer 46 in FIG. 3, while all the rest of the nuclear spins have been rotated into the X,Y plane as illustrated by the pointer 47 shown in broken lines in FIG. 3. The signal portion 44 effects, similarly to the first signal portion 42, a selective rotation by −45° of only those nuclear spins which are contained in the plane 4 so that thereafter the nuclear spins contained in this plane have resumed their orientation in the Z direction.

Thereafter, the gradient field $G_Z$ is switched off and the gradient field $G_Y$ is applied instead. The latter has again the same orientation as the homogeneous magnetic field $M_0$, but a field strength varying in the direction of the Y axis so that now a field gradient in Y direction is encountered. The body 2 is again subjected to a HF signal comprising three signal portions 52, 53 and 54. The signal portion 52 and 53 provoke again a selective rotation by −45° of only those nuclear spins which are contained in a plane extending vertically to the Y axis whereby a strip 5 containing the selected volume element 1 is excited in the previously excited disk 4. The signal portion 53 causes the nuclear spins to be found outside the strip 5 in the plane 4 to be once more rotated by 90°, back into the X,Y plane. It cannot be said with certainty what rotations are performed during this process by the nuclear spins contained in the body 2, outside the plane 4, which have been excited before on a different occasion, because due to the spin-spin relaxation and due to the variations of the field strength occurring when the gradient fields are switched on and off these nuclear spins have meanwhile spread evenly in the X,Y plane.

Upon completion of the excitation serving to select the strip 5, the gradient field $G_Y$ is switched off and a gradient field $G_X$ is switched on instead. The latter presents the same orientation as the homogeneous magnetic field $M_0$, but a field strength which varies along the X axis. So it is possible, by corresponding selection of the Larmor frequency, to selectively excite an area occupying a specific position along the X axis, i.e. a specific volume element 1 in the strip 5. So, when the gradient field $G_X$ is applied (FIG. 2a), the body 2 is subjected to a HF signal comprising three signal portions 12, 13, 14. The signal portions 12 and 14 provoke again, in the manner described before, a selective rotation by −45° of only those nuclear elements which are contained in the volume element 1, while the HF pulse 13 rotates the entirety of all nuclear spins contained in the body 2, and in particular the nuclear spins contained in the strip 5, outside the volume element 1, by 90°. Following this excitation, only the volume element 1 contains nuclear spins which in their entirety have resumed the orientation of the homogeneous magnetic field $M_0$, i.e. which are in a static state of rest which is not influenced, neither by relaxation processes nor by the switching-off of the gradient field $G_X$. If, therefore, the body 2 is exposed to an excitation pulse 15, in particular a 90° pulse, after the gradient field $G_X$ has been switched off, the nuclear spins contained in the volume element 1 are in their entirety rotated into the X,Y plane and, thus, excited to generate an induction signal 16 (FIG. 2c) which can be received and processed in the usual manner. All other nuclear spins are in contrast spread in the body 2 in substantially static distribution, and although they will of course also supply induction pulses after having been excited by the pulse 15, these induction signals will balance each other or annul each other in average.

It should be appreciated that one or more excitation pulses 15 may be utilized to generate the induction signal 16, and that the illustration shown in FIGS. 2b, 2c, 2d and 2e of the excitation pulse(s) 15 and induction signal 16 are general in nature and may represent one or more excitation pulses and/or induction signals.

To obtain high resolution, it is of particular importance to prevent interference by field gradients and, consequently, to ensure that no magnetic field other than the homogeneous magnetic field $M_0$ is encountered and that the spins of the selected volume element have a stationary orientation in the homogeneous magnetic field before they are excited, for instance, by a 90° pulse. It is, therefore, also possible to provoke the excitation of the selected nuclear spins in the selected volume element not by one single 90° pulse but by pulse sequences of the type generally used for improving the signal-to-noise ratio and for determining relaxation times in NMR spectroscopy, as for instance a Carr-Purcell sequence.

Although it is generally to be expected that the induction signals supplied by the selected nuclear spins to be found in the body 2 outside the selected volume element 1 annul each other or cancel themselves in average, it may in practice happen that these nuclear spins supply a resulting signal portion which may quickly reach the level of the signals supplied by the volume element 1, because the selected volume element represents very often only a very small fraction of the entire body. It is by no means an exception that the total volume of the body is equal to $10^4$ times the volume of the selected volume element 1. Accordingly, the nuclear spins contained in the rest of the body 2 will supply already a resulting signal in the range of the signal supplied by the selected volume element 1 when the before-mentioned self-compensation remains only $10^{-3}$ to $10^{-4}$ times below complete cancellation. But the method of the invention provides the possibility to eliminate even these residual signals having their origin in the volume of the body 2.

To this end, the experiment described above is carried out twice, but so that at the end of two successive selective excitation processes the selected nuclear spins in the volume element 1 are alternately oriented in the sense of the homogeneous magnetic field $M_0$, and in opposite direction. Following the excitation of the nuclear spins in the body 2 illustrated in FIG. 2b, one may, for example, effect during a subsequent measuring process an excitation of the type illustrated in FIG. 2d where an excitation by means of the HF signals 42, 43, 44 or 52, 53, 54 identical to that described before is effected, with the gradient fields $G_Z$ and $G_Y$ applied. But after application of the gradient field $G_Z$, the nuclear spins are excited using a HF signal whose signal portions 12' and 14' effect a selective rotation in the ZX plane by +45° of only those nuclear spins which are contained in the volume element 1.

Figure 2E:
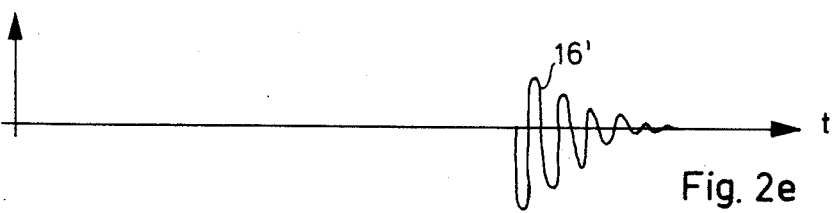

Accordingly, the nuclear spins contained in the volume element 1 are rotated by the signal portion 12' by +45° from the Z direction represented by the pointer 17 in FIG. 4. When thereafter all nuclear spins are rotated by the pulse 13 by 90°, the nuclear spins contained in the volume element 1 take the position illustrated by the pointer 18 in which they are displaced by 135° relative to the Z direction. The last rotation effected by the signal portion 14' brings the nuclear spins in the volume element 1 into the Z direction. Now, if after the gradient field G$_X$ has been switched off these nuclear spins are excited by a 90° pulse 15, they supply an induction signal 16' which is phase-shifted by 180° relative to the induction signal obtained during the preceding measurement (FIG. 2e). When the induction signals 16 and 16' obtained during two successive measurements are subtracted from each other, their absolute values are in fact added, due to their opposition in phase. In contrast, the nuclear spins to be found outside the volume element 1 have been subjected in both measurements to exactly the same excitations so that the nuclear spins outside the volume element 1, and in particular those contained in the strip 5, have been rotated both times in X direction so that they supply identical resulting signals which annul each other when they are subsequently subtracted, and this even though they are subjected to identical variations following the excitation. It goes without saying that the same result is achieved when the signal portions are alternately selected to obtain signals of equal phase from the nuclear spins present within the volume element 1, and signals of opposite phase from the nuclear spins present outside the said volume element so that these signals cancel each other when they are added.

In the event that disturbing residual signals should still remain after application of this subtraction or addition method, there exists the possibility to use selective saturation signals when the gradient fields are applied in order to minimize from the very beginning the number of nuclear spins that could supply disturbing signals. Considering, however, that these saturation signals do not serve the purpose of selecting the selected volume element, the shape of these saturation signals is not very critical. The only requirement that must be fulfilled is that a large portion of the nuclear spins contained in the body 2 must be prevented by the saturation from supplying signal portions, although the boundaries of the saturated portion in the neighborhood of the selected volume element need not be sharply defined.

The method of the invention can be easily carried out with the devices heretofore used in high-resolution NMR spectrometry and NMR tomography and comprising, for instance, synthesizers and pulse generators for generating the required HF signals, the known means for generating a strong, homogeneous magnetic field and the gradient fields, and means for receiving and analyzing the induction signal.

We claim:

1. A method for measuring the nuclear magnetic resonance in a selected volume element of a body, in which the interesting nuclear spins contained in the selected volume element are selectively excited while being subjected to a highly homogeneous stationary magnetic field M$_0$, characterized by the steps of superimposing upon the homogeneous magnetic field M$_0$ passing through the entire body a first magnetic field gradient G$_Z$ of identical orientation whose strength varies in a first sense, exciting thereafter all the selected nuclear spins present within the body and in addition, selectively, only the nuclear spins present in a first body plane containing the volume element and extending vertically to the first field gradient G$_Z$ so that the selected nuclear spins contained in this body plane are returned to the sense of the homogeneous magnetic field M$_0$ while the nuclear spins outside this plane have an orientation differing from the sense of the homogeneous magnetic field M$_0$, switching off thereafter the first gradient field and superimposing upon the homogeneous magnetic field M$_0$ a second gradient field G$_Y$ exhibiting in turn an orientation identical to that of the homogeneous magnetic field M$_0$ and varying in a sense vertical to the first field gradient G$_Z$, effecting thereafter a second similar excitation of the entirety of the selected nuclear spins contained in the selected body plane and a selective excitation of the selected nuclear spins contained only in a plane containing the volume element and extending perpendicular to the second field gradient, whereafter the nuclear spins contained in a strip defined by the intersection lines of the two planes resume again an orientation identical to that of the homogeneous magnetic field M$_0$, switching off thereafter the second gradient field G$_Y$ and superimposing upon the homogeneous magnetic field M$_0$ a third gradient field G$_X$ having the same orientation as the homogeneous magnetic field M$_0$ and varying in a sense perpendicular to the said first and the said second field gradients, G$_Z$, G$_Y$, effecting thereafter a third similar excitation of the entirety of the selected nuclear spins in the strip and a selective excitation of only those nuclear spins which are contained in a third plane containing the volume element and extending perpendicularly to the said strip so that now only the nuclear spins in the selected volume element have the same orientation as the homogeneous magnetic field M$_0$, and finally switching off the third gradient field G$_X$ and exciting the nuclear spins contained in the volume element by means of one or more pulses to obtain an oscillation generating an induction signal.

2. A method in accordance with claim 1, characterized in that at least when one of the gradient fields G$_Z$, G$_Y$, G$_X$ is switched on the entirety of the selected nuclear spins is excited by a 90° pulse.

3. A method in accordance with claim 2, characterized in that at least when one of the gradient fields G$_Z$, G$_Y$, G$_X$ is switched on the excitation of the nuclear spins is effected by a HF signal which effects initially a rotation of the nuclear spins arranged in the selected plane by an angle $\alpha$ of less than 90°, then a rotation of all selected nuclear spins by 90°, and finally once more a rotation of the nuclear spins found in the selected plane by an angle of (90° $-\alpha$).

4. A method in accordance with claim 3, characterized in that the angles $\alpha$ and (90° $-\alpha$) are equal to 45° each.

5. A method in accordance with claim 1, characterized in that at least when one of the gradient fields G$_Z$, G$_Y$, G$_X$, is switched on the HF signal used for exciting the nuclear spins consists of a sequence of separate pulses having different carrier frequencies, amplitudes and/or phases.

6. A method in accordance with claim 1, characterized in that at least when one of the gradient fields G$_Z$, G$_Y$, G$_X$ is switched on the HF signal used for exciting the nuclear spins is formed by a preferably symmetrical pulse with alternating carrier frequency, amplitude and/or phase.

7. A method in accordance with claim 1, characterized in that the measurements are carried out in pairs so that upon completion of the last excitation process the nuclear spins contained in the selected volume element exhibit alternately an orientation identical and opposite to that of the homogeneous magnetic field M$_0$ and the induction signals are subtracted from each other.

8. A method in accordance with claim 1, characterized in that at least when one of the gradient fields G$_Z$, G$_Y$, G$_X$ is switched on the body is subjected to a HF signal which effects substantially complete saturation of the selected nuclear spins located outside the selected plane before the nuclear spins are subjected to the excitation fields.

* * * * *